United States Patent
Chen et al.

(10) Patent No.: US 8,779,821 B2
(45) Date of Patent: Jul. 15, 2014

(54) SIGNAL DELAY CIRCUIT AND SIGNAL DELAY METHOD

(75) Inventors: Shih-Lun Chen, Taipei (TW); Ming-Jing Ho, Taipei (TW)

(73) Assignees: Global Unichip Corp., Hsinchu Science Park, Hsinchu (TW); Taiwan Semiconductor Manufacturing Co., Ltd., Hsin-Chu Science Park, Hsin-Chu (TW)

( * ) Notice: Subject to any disclaimer, the term of this patent is extended or adjusted under 35 U.S.C. 154(b) by 0 days.

(21) Appl. No.: 13/480,492

(22) Filed: May 25, 2012

(65) Prior Publication Data
US 2013/0127508 A1 May 23, 2013

(30) Foreign Application Priority Data
Nov. 17, 2011 (TW) .............................. 100142157 A (51) Int. Cl.
*H03H 11/26* (2006.01)
*H03K 5/13* (2014.01)
*H03K 5/135* (2006.01)

(52) U.S. Cl.
CPC ................ *H03K 5/133* (2013.01); *H03K 5/135* (2013.01)
USPC ............................ 327/276; 327/277; 327/278

(58) Field of Classification Search
CPC ........ H03K 5/132; H03K 5/133; H03K 5/135
USPC .......................................... 327/276, 277, 278
See application file for complete search history.

(56) References Cited

U.S. PATENT DOCUMENTS

2005/0110540 A1* 5/2005 Kwak ........................... 327/158
2010/0327934 A1* 12/2010 Kapusta et al. ............... 327/284

* cited by examiner

*Primary Examiner* — John Poos
(74) *Attorney, Agent, or Firm* — Winston Hsu; Scott Margo (57) ABSTRACT

A signal delay circuit comprising: a first delay stage, for delaying a first input signal to generate a first delay signal; and a second delay stage, for cooperating with part of delay units of the first delay stage to delay the first delay signal to generate a second delay signal. The signal delay circuit selectively enables the delay stages of the first delay stage or the second delay stage, wherein the signal delay circuit mixes the first delay signal and the second delay signal to generate a first mixed signal when the first delay stage and the second delay stage are both enabled.

8 Claims, 8 Drawing Sheets

SIGNAL DELAY CIRCUIT AND SIGNAL DELAY METHOD

BACKGROUND OF THE INVENTION

1. Field of the Invention

The present invention relates to a signal delay circuit and a signal delay method, and particularly relates to a signal delay circuit and a signal delay method, which mix delay signals with different delay amount.

2. Description of the Prior Art

Figure 1:
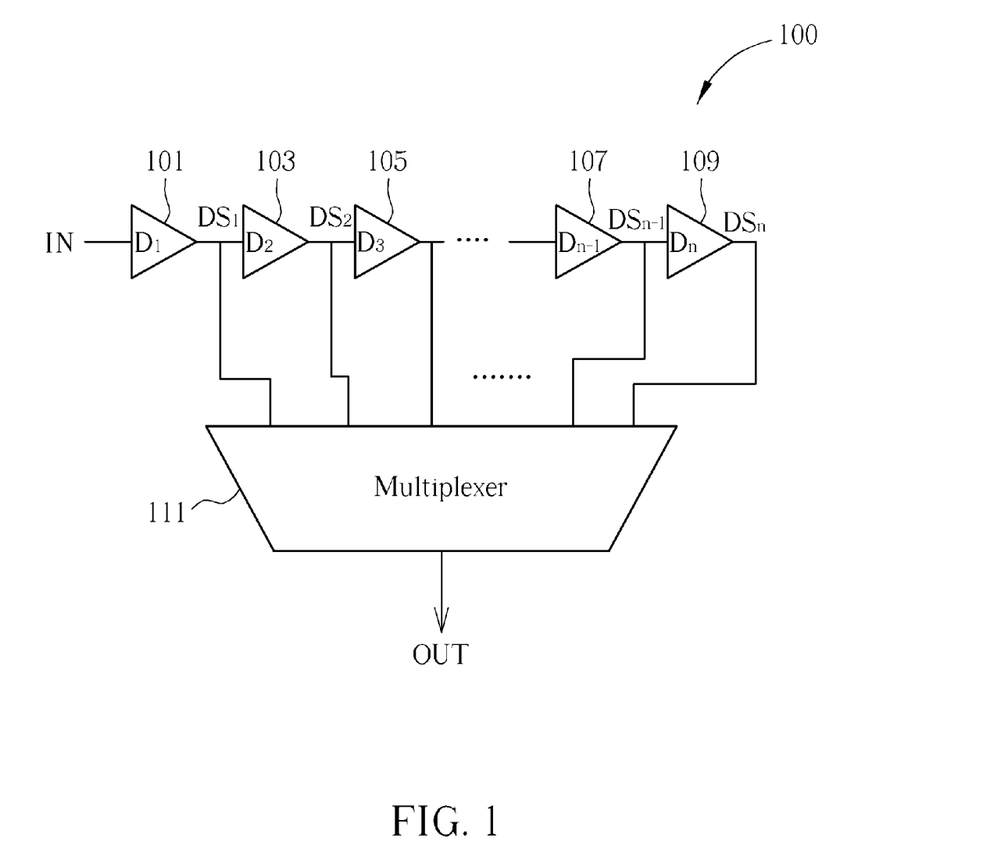
FIG. 1 illustrates a prior art signal delay circuit.

FIG. 1 illustrates a prior art signal delay circuit. As shown in FIG. 1, the signal delay circuit 100 includes a plurality of continuous delay stages 101-109. The delay stage 101 delays an input signal IN to generate a delay signal $DS_1$, and the delay stage 103 delays the delay signal DS1 from a previous delay stage to generate a delay signal $DS_2$ . . . . That is, the outputs of each delay stage has different delay amounts from the input signal IN. After that, the signal delay circuit utilizes a multiplexer 111 to select one of the delay signals $DS_1$, $DS_2$ . . . $DS_{n-1}$, $DS_n$ as the output signal OUT. However, complicated design for the multiplexer 111 is needed in this structure. Also, some delay will be caused to the signals. Furthermore, higher accuracy for signals is needed since speed of modern electronic devices largely increases. Therefore, the signal delay circuit 100 needs more delay stages to reach such requirement. Thereby the circuit region increases and the complexity for controlling the signal delay circuit 100 goes up as well.

In some signal delay circuits, a plurality of multiplexers are utilized as delay stages, and a plurality of control signals are applied thereon to select. However, more than two output terminals and more than two multiplexers are needed for this structure. Accordingly, more circuit region is needed and hard to be controlled. Besides, such structure causes more input loading.

Therefore, a signal delay circuit and a signal delay method are needed to improve above-mentioned problems.

SUMMARY OF THE INVENTION

One objective of the present application is to provide a signal delay circuit and a signal delay method with low input loading and smaller circuit region.

One embodiment of the present invention discloses a signal delay circuit, comprising: a first delay stage, for delaying a first input signal to generate a first delay signal; and a second delay stage, for cooperating with part of delay units of the first delay stage to delay the first delay signal to generate a second delay signal; wherein the signal delay circuit can selectively enable the delay units of the first delay stage or the second delay stage, wherein the signal delay circuit mixes the first delay signal and the second delay signal to generate a first mixed signal when the first delay stage and the second delay stage are both enabled.

Another embodiment of the present invention discloses a signal delay method, for a signal delay circuit including a first delay path and a second delay path, wherein the first delay path and the second delay path share at least one delay unit. The signal delay method comprises: utilizing the first delay path to delay a first input signal to generate a first delay signal; utilizing the second delay path to delay the first input signal to generate a second delay signal; and mixing the first delay signal and the second delay signal to generate a first mixed signal.

In view of above-mentioned embodiments, the signal delay circuit according to the present invention can have smaller input and output loading. Additionally, different mixed signals can be utilized to perform fine tune to obtain more accurate clock signals, besides utilizing each delay stage to perform coarse tune. Moreover, delay for coarse tune and fine tune have better adjusting linearity since the same delay stage(s) is/are utilized to perform both the fine tune and coarse tune.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
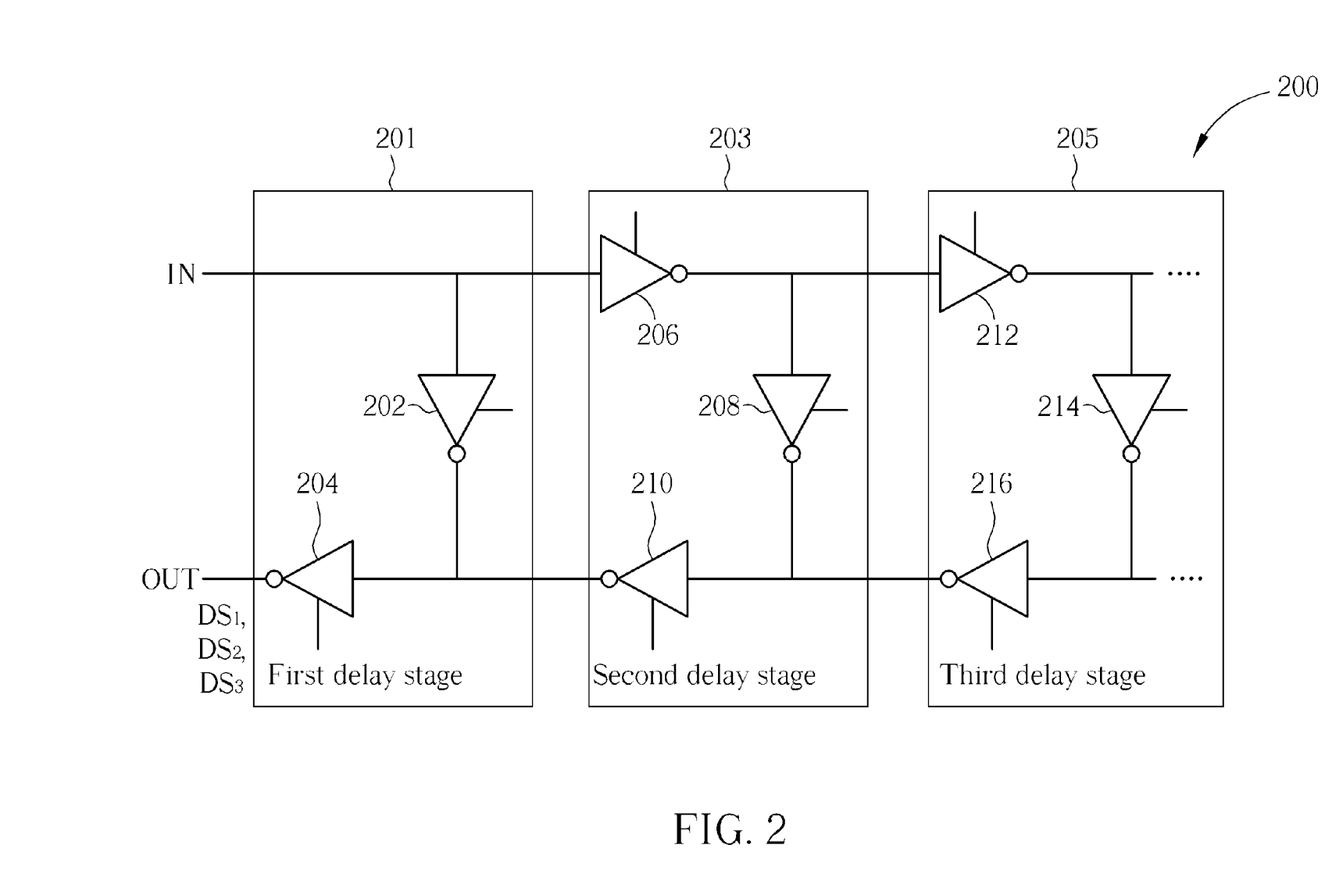
FIG. 2 is a circuit diagram illustrating a signal delay circuit according to one embodiment of the present invention.

FIG. 2 is a circuit diagram illustrating a signal delay circuit according to one embodiment of the present invention. AS shown in FIG. 2, the signal delay circuit 200 includes a first delay stage 201, a second delay stage 203 and a third delay stage 205. It should be noted that although FIG. 2 depicts three delay stages, but it does not mean to limit the number of delay stages. The number of delay stages can be more or less than three. In FIG. 2, the first delay stage 201 delays the input signal IN to generate $DS_1$ at the output terminal OUT. The second delay stage 203 cooperates with part of the first delay stage 201 to delay the input signal IN to generate $DS_2$ at the same output terminal OUT. Similarly, the third delay stage 205 cooperates with part of the first delay stage 201 and part of the second delay stage 203 to delay the input signal IN to generate $DS_3$ at the same output terminal OUT. The detail operation for generating delay signals $DS_1$, $DS_2$ and $DS_3$ will be described as below.

In one embodiment, the first delay stage 201 includes delay units 202, 204, and the second delay stage 203 includes delay units 206, 208 and 210. The input terminals of the delay unit 202 and the delay unit 206 receive the input signal IN. The input terminal of the delay unit 204 can receive outputs of the delay units 202 and 210. The input terminal of the delay unit 208 receives the output of the delay unit 206, and the input terminal of the delay unit 210 receives the output of the delay unit 208. Similarly, the third delay stage 205 includes delay units 206, 208 and 210, and the arrangement thereof is the same as which of the second delay stage 203, this is omitted for brevity here.

Figure 3:
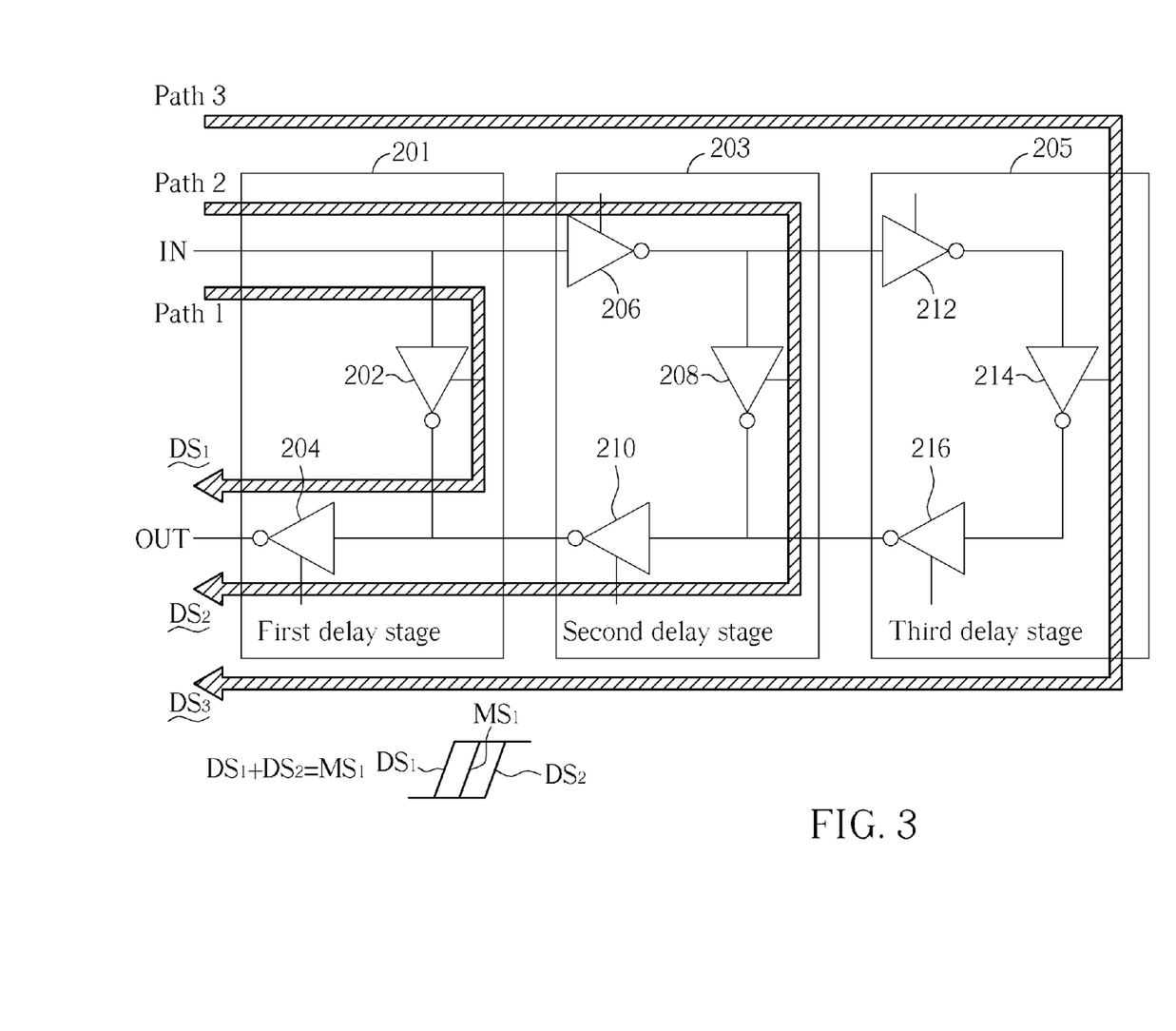
FIG. 3 is a schematic diagram illustrating the operation for the signal delay circuit shown in FIG. 2.

FIG. 3 is a schematic diagram illustrating the operation for the signal delay circuit shown in FIG. 2. As shown in FIG. 3, the delay signal $DS_1$ is generated by path 1, which has an order of: delay unit 202 to 204, and then to the output terminal OUT. The delay signal $DS_2$ is generated by path 2, which has an order of: delay unit 206 to 208, 210, 204 and then to the output terminal OUT. Similarly, the delay signal $DS_3$ is generated by path 3, which has an order of: delay unit 206 to 212, 214, 216, 210, 204 and then to the output terminal OUT. That is, the delay signal $CS_1$ is generated by only the first delay stage 201, the delay signal $CS_2$ is generated by the second delay stage 203 with part of the first delay stage 201 (the delay unit 204). Also, the delay signal $CS_3$ is generated by the third delay stage 205 with part of the second delay stage 203 (delay units 206 and 210) and part of the first delay stage 201 (the delay unit 204). It should be noted, in this embodiment, the delay unit is implemented by an inverter and the signal delay circuit 200 is designed that the input signal IN and the output signal OUT do not have opposite phases. Accordingly, the first delay stage 201 includes only two delay units 202 and 204, but the second delay stage 203 and the third delay stage 205 both have three delay units. However, the first delay stage 201 can have three delay stages if the item that the phases are opposite or not is not concerned. Besides, the delay unit can be implemented by other devices, and the arrangement and the number thereof will be different corresponding to used devices.

The signal delay circuit according to the present invention not only can generate delay signals with different delay amounts via different paths but also can generate mixed signals with different delay amount via combining more than two paths. Take the embodiment shown in FIG. 2 for example, $DS_1$ and $DS_2$ will be combined to generate a first mixed signal $MS_1$ if path 1 and path 2 are combined. The delay amount of the first mixed signal $MS_1$, which is named first mixed delay amount here, is between the delay amounts of $DS_1$ and $DS_2$. The value thereof can be computed by mathematical function such as interpolation. The detail steps of how to compute $MS_1$ based on $DS_1$, $DS_2$ are well known for persons skilled in the art, thus is omitted for brevity here. Similarly, if path 1, path 2, and path 3 are combined, $DS_1$, $DS_2$ and $DS_3$ can be combined to generate a mixed signal. Also, a different mixed signal can be generated if path 3 is combined with one of path 1 and path 2.

Figure 4:
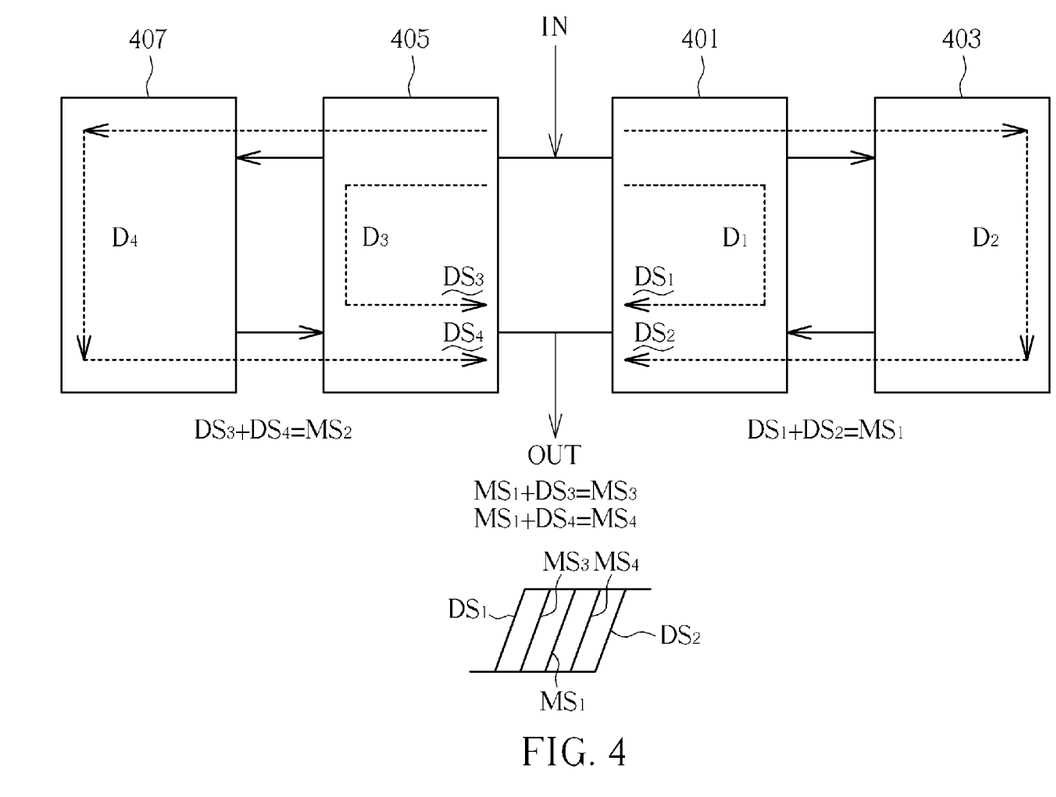
FIG. 4-FIG. 7 are extended embodiments for the embodiment shown in FIG. 2.
Figure 5:
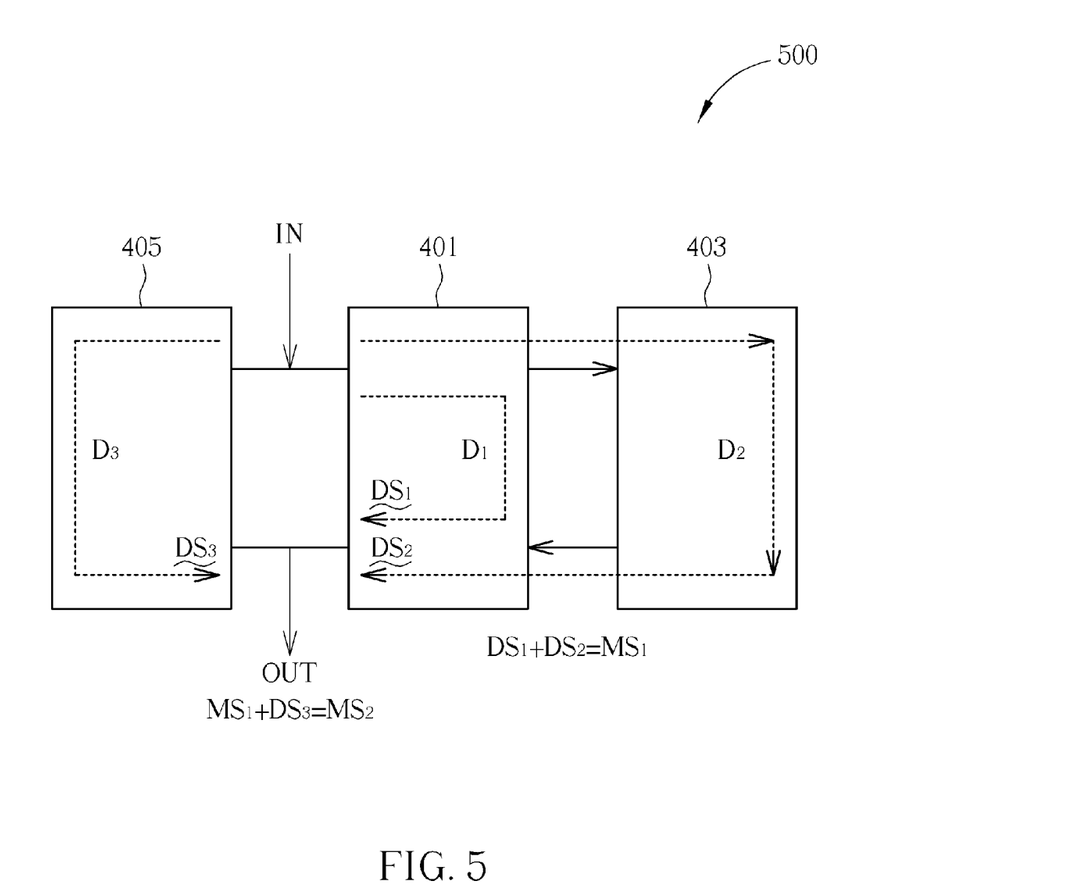
Figure 6:
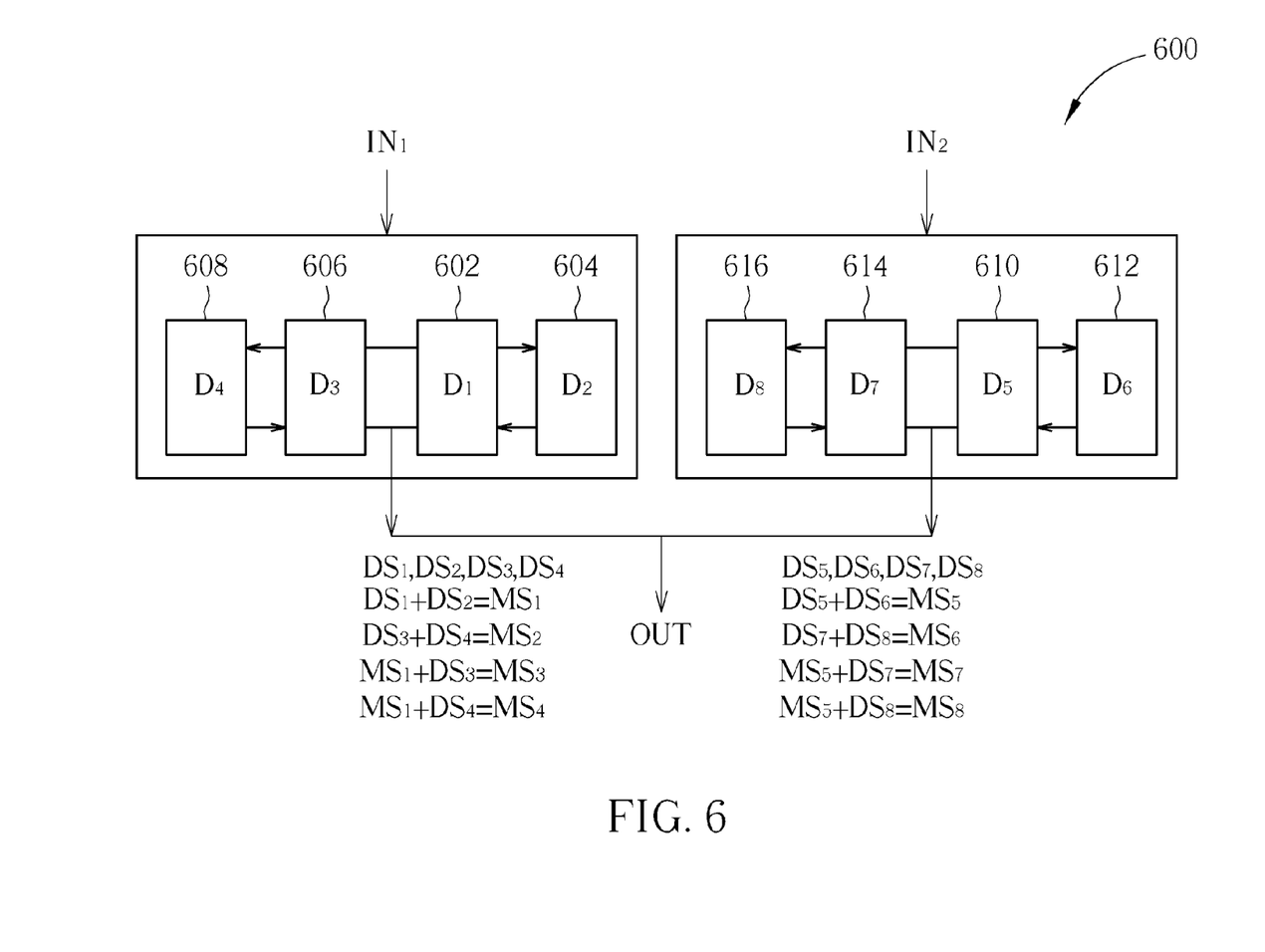

The signal delay circuit of the present invention can have other arrangement besides the delay stage arrangement shown in FIG. 2 and FIG. 3. FIG. 4-FIG. 6 are extended embodiments for the embodiment shown in FIG. 2. It should be noted that the first delay stage is symbolized as $D_1$ and the second delay stage is symbolized as $D_2$ . . . in following embodiments for brevity. In the embodiment shown in FIG. 4, the first delay stage 401 and the second delay stage 403 can be utilized to generate delay signals $DS_1$, $DS_2$ or mix delay signals $DS_1$, $DS_2$ to generate a mixed signal $MS_1$, as above-mentioned description. Similarly, the third delay stage 405 and the fourth delay stage 407 can be utilized to generate delay signals $DS_3$, $DS_4$ or mix delay signals $DS_3$, $DS_4$ to generate a mixed signal $MS_2$. The signals from two sides can be further mixed to generate a new mixed signal. For example, a new mixed signal $MS_3$ can be generated via mixing the mixed signal $MS_1$ with the delay signal $DS_3$, and a new mixed signal $MS_4$ can be generated via mixing the mixed signal $MS_1$ with the delay signal $DS_4$. The relation between the delay signals $DS_1$, $DS_2$, and mixed signals $MS_1$, $MS_3$ and $MS_4$ can be shown as FIG. 4. It should be noted that, the mixed signal $MS_1$ generated from the delay stages 401, 403 and the delay signals $DS_3$ and $DS_4$ generated from the delay stages 405, 407 are taken for example. However, if the mixed signal $MS_1$ is replaced with the mixed signal $MS_2$ generated from the delay stages 405, 407, and delay signals $DS_3$, $DS_4$ are replaced with delay signals $DS_1$ and $DS_2$ generated from the delay stages 401, 403, the signals still have the same relation.

In one embodiment, if the delay amount of the third delay stage 405 is designed to be the same with which of the first delay stage 401, and the delay amount of the fourth delay stage 407 is designed to be the same with which of the second delay stage 403, then $DS_3$ will be the same as $DS_1$, and $DS_2$ will be the same as $DS_4$. In this case, only one of the first delay stage 401 and the third delay stage 405 is enabled, or both are enabled, will cause the same situation. That is, generate $DS_1$ at the output terminal OUT. Similarly, only one of the second delay stage 403 and the fourth delay stage 407 is enabled, or both are enabled, will cause the same situation. That is, generate $DS_2$ at the output terminal OUT.

The signal delay circuit of the present invention is not limited to the symmetrical structure shown in FIG. 4, which has symmetric delay stages at both sides. In FIG. 5, the signal delay circuit 500 does not include the fourth delay stage 407 shown in FIG. 4. The operation for the signal delay circuit 500 shown in FIG. 5 is similar with the signal delay circuit 400 shown in FIG. 4. The first delay stage 401 and the second delay stage 403 can be utilized to generate delay signals $DS_1$, $DS_2$ or the mixed signal $MS_1$. The mixed signal $MS_1$ and the delay signal $DS_3$ can be mixed to generate the mixed signal $MS_2$. As above-mentioned, if the delay amount of the third delay stage 405 is adjusted to be the same as which of the first delay stage 401, $DS_3$ will be the same as $DS_1$. Also, if the first delay stage 401 and the third delay stage 405 are both enabled but the second delay stage 403 is disabled, $DS_1$ will be generated at the output terminal OUT. Similarly, if the delay amount of the third delay stage 405 is adjusted to be the same as which of the delay signal $DS_2$, $DS_3$ will be the same as $DS_2$. In this case, if the second delay stage 403 and the third delay stage 405 are both enabled but part of the delay units of the first delay stage 401 is disabled such that $DS_1$ is not generated, $DS_2$ will be generated at the output terminal OUT.

Moreover, the signal delay circuit of the present invention can receives different input signals and outputs delay signals with more variation. In FIG. 6, the signal delay circuit 600 includes first to eighth delay units 602-612. The first to fourth delay units 602-608 receive the first input signal $IN_1$, and the fifth to eighth delay units 612-616 receive the second input signal $IN_2$. As above-mentioned description, first to fourth delay units 602-608 can generate delay signals $DS_1$, $DS_2$, $DS_3$, $DS_4$ and mixed signals $MS_1$ ($DS_1+DS_2$), $MS_2$ ($DS_3+DS_4$), $MS_3(MS_1+DS_3)$, $MS_4(MS_1+DS_4)$. Similarly, fifth to eighth delay units 610-616 can generate delay signals $DS_5$, $DS_6$, $DS_7$, $DS_8$ and mixed signals $MS_5$ ($DS_5+DS_6$), $MS_6$ ($DS_7+DS_8$), $MS_7$ ($MS_5+DS_7$), $MS_8(MS_5+DS_8)$. Signals of one side can be mixed with signals with the other side to generate a new mixed signal at the output terminal OUT. For example, a new mixed signal can be generated via mixing $MS_4$ and $MS_7$.

Figure 7:
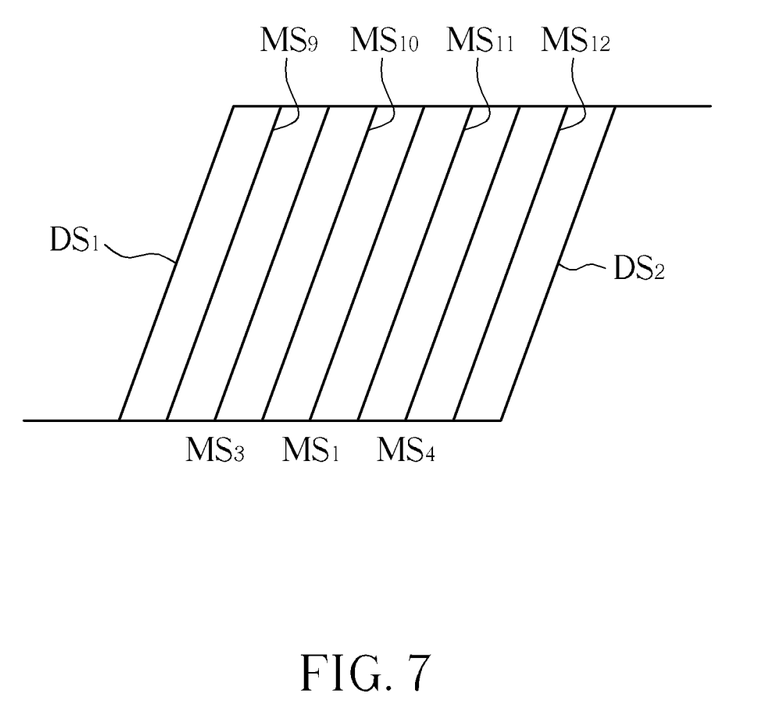

In one embodiment, the delay amounts of the first, the third, the fifth and the seventh delay units 602, 606, 610 and 614 are set to be the same, and the delay amounts of the second, the fourth, the sixth and the eighth delay units 604, 608, 612 and 616 are set to be the same. In this case, $DS_1=DS_3=DS_5=DS_7=DS_2=DS_4=DS_6=DS_8$
$MS_1=MS_2=MS_5=MS_6, MS_3=MS_7, MS_4=MS_8$. The relations for each signal can be shown as FIG. 7. In FIG. 7, $MS_9$ is generated via mixing $MS_3$ and $DS_1$, $MS_{19}$ is generated via mixing $MS_1$ and $MS_3$, $MS_{11}$ is generated via mixing $MS_1$ and $MS_4$, $MS_{12}$ is generated via mixing $MS_4$ and $DS_2$.

Figure 8:
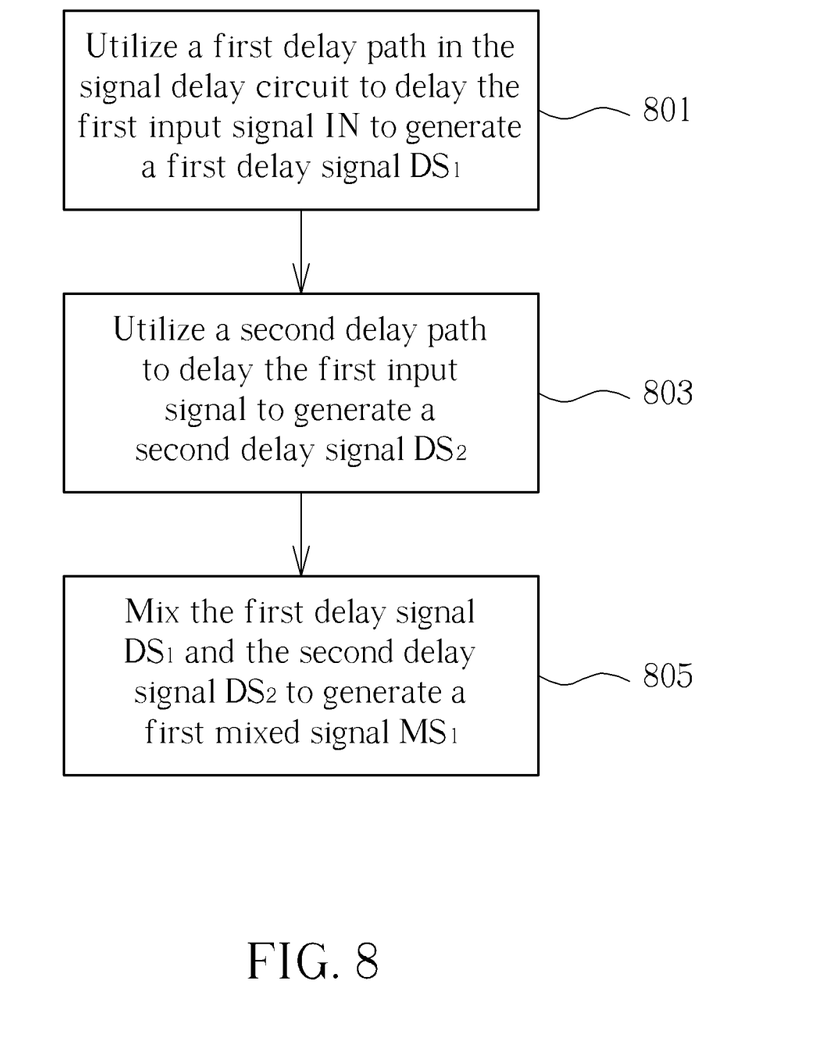
FIG. 8 illustrates a signal delay method according to an embodiment of the present invention.

In view of above-mentioned embodiments, the signal delay method shown in FIG. 8 can be obtained, which includes the following steps:

801

Utilize a first delay path, such as path 1 in FIG. 3, in the signal delay circuit to delay the first input signal IN to generate a first delay signal $DS_1$.

803

Utilize a second delay path, such as path 2 in FIG. 3, to delay the first input signal to generate a second delay signal $DS_2$.

805

Mix the first delay signal $DS_1$ and the second delay signal $DS_2$ to generate a first mixed signal $MS_1$.

Corresponding to the embodiment shown in FIG. 5, the signal delay method depicted in FIG. 8 further comprise: utilizing a third delay path, such as the path passing through the third delay stage 405 in FIG. 5, to delay the first input signal IN to generate a third delay signal $DS_3$. Also, the third delay signal $DS_3$ can be utilized to mix with one of the first delay signal $DS_1$ and the second delay signal $DS_2$ to generate a mixed signal.

Corresponding to the embodiment shown in FIG. 4, the signal delay method depicted in FIG. 8 further comprise: utilizing a fourth delay path, such as the path passing through the fourth delay stage 407 in FIG. 4, to delay the first input signal IN to generate a fourth delay signal $DS_4$. The third and the fourth delay paths share at least one delay unit. The third delay signal $DS_3$ and the fourth delay signal $DS_4$ are mixed to generate a second mixed signal $MS_2$, and the first mixed signal $MS_1$ can be mixed with one of the third delay signal $DS_3$, the fourth delay signal $DS_4$ and the second mixed signal $MS_2$ to generate a new mixed signal.

Corresponding to the embodiment shown in FIG. 4, the signal delay method depicted in FIG. 8 further comprise: utilizing the fifth delay path, such as the path passing through the fifth delay stage 610 in FIG. 6, to delay a second input signal IN2 to generate a fifth delay signal $DS_5$; utilizing the sixth delay path, such as the path passing through the sixth delay stage 612 in FIG. 6, to delay the second input signal $IN_2$ to generate a sixth delay signal DS6, wherein the fifth delay path and the sixth path share at least one delay unit; utilizing the seventh delay path, such as the path passing by the seventh delay stage 614 in FIG. 6, to delay the second input signal $IN_2$ to generate a seventh delay signal $DS_7$; utilizing the eighth delay path, such as the path passing by the eighth delay stage 616 in FIG. 6, to delay the second input signal $IN_2$ to generate a eighth delay signal $DS_8$, wherein the seventh delay path and the eighth path share at least one delay unit. The signal delay method further comprises mixing the fifth delay signal $DS_5$ and the sixth delay signal $DS_6$ to generate a fifth mixed signal $MS_5$ and mixing the seventh delay signal $DS_7$ and the eighth delay signal $DS_8$ to generate a sixth mixed signal $MS_6$. The fifth mixed signal $MS_5$ can be mixed with one of the seventh delay signal $DS_7$, the eighth delay signal $DS_8$ and the sixth mixed signal $MS_6$ to generate a new mixed signal.

In view of above-mentioned embodiments, the signal delay circuit according to the present invention can have smaller input and output loading. Additionally, different mixed signals can be utilized to perform fine tune to obtain more accurate clock signals, besides utilizing each delay Stage to perform coarse tune. Moreover, delay for coarse tune and fine tune have better adjusting linearity since the same delay stage(s) is/are utilized to perform both the fine tune and coarse tune.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal delay circuit, comprising:
   a first delay stage, for delaying a first input signal to generate a first delay signal; and
   a second delay stage, for cooperating with part of delay units of the first delay stage to delay the first input signal to generate a second delay signal;
   wherein the signal delay circuit selectively enables the delay units of the first delay stage or the second delay stage; and wherein the signal delay circuit mixes the first delay signal and the second delay signal to generate a first mixed signal when the first delay stage and the second delay stage are both enabled;
   wherein the first delay stage has a first delay unit and a second delay unit, the second delay stage has a third delay unit, a fourth delay unit and a fifth delay unit; wherein an input terminal of the first delay unit and an input terminal of the third delay unit receive the first input signal, an input terminal of the second delay unit receives an output of the first delay unit and an output of the fifth delay unit, an input terminal of the fourth delay unit receives an output of the third delay unit, and an input terminal of the fifth delay unit receives an output of the fourth delay unit.

2. The signal delay circuit of claim 1, wherein the first delay signal is generated by delaying the first input signal via the first delay stage and the second delay stage, and the second delay signal is generated by delaying the first input signal via the second delay stage, the third delay stage, the fourth delay stage and the fifth delay stage.

3. A signal delay circuit, comprising:
   a first delay stage, for delaying a first input signal to generate a first delay signal; and
   a second delay stage, for cooperating with part of delay units of the first delay stage to delay the first input signal to generate a second delay signal;
   wherein the signal delay circuit selectively enables the delay units of the first delay stage or the second delay stage; and wherein the signal delay circuit mixes the first delay signal and the second delay signal to generate a first mixed signal when the first delay stage and the second delay stage are both enabled;
   a third delay stage, for delaying the first input signal to generate a third delay signal, wherein the signal delay circuit selectively enables delay units of the third delay stage; and
   a fourth delay stage, for cooperating with part of delay units of the third delay stage to delay the first delay signal to generate a fourth delay signal, wherein the signal delay circuit selectively enables the delay units of the fourth delay stage;
   wherein the signal delay circuit mixes the third delay signal and at least one of the first, the second delay signals to generate a mixed signal when the third delay stage is enabled;
   wherein the third delay signal and the fourth delay signal are mixed to generate a second mixed signal, and the first mixed signal is mixed with one of the third delay signal, the fourth delay signal and the second mixed signal to generate a new mixed signal when the third delay stage and the fourth delay stage are both enabled.

4. The signal delay circuit of claim 3, wherein the third delay signal includes a third delay amount being the same as a first delay amount from the first delay signal, and the fourth delay signal includes a fourth delay amount being the same as a second delay amount from the second delay signal; wherein the signal delay circuit generates the first delay signal if the first and third delay stages are enabled but the second and fourth delay stage are disabled; and wherein the signal delay circuit generates the second delay signal if the second and fourth delay stages are enabled but the first and third delay stages are disabled.

5. The signal delay circuit of claim 3, further comprising:
a fifth delay stage, for delaying a second input signal to generate a fifth delay signal;
a sixth delay stage, for cooperating with part of delay units of the fifth delay stage to delay the second input signal to generate a sixth delay signal;
a seventh delay stage, for delaying the second input signal to generate a seventh delay signal;
an eighth delay stage, for cooperating with part of delay units of the seventh delay stage to delay the second input signal to generate a eighth delay signal;
wherein the signal delay circuit selectively enables delay units of the fifth, the sixth, the seventh and the eighth delay stages;
wherein the signal delay circuit mixes the fifth delay signal and the sixth delay signal to generate a fifth mixed signal if the fifth delay stage and the sixth delay stage are both enabled;
wherein the signal delay circuit mixes the seventh delay signal and the eighth delay signal to generate a sixth mixed signal if the seventh delay stage and the eighth delay stage are both enabled;
wherein the fifth mixed signal is mixed with one of the seventh delay signal, the eighth delay signal and the sixth mixed signal to generate a new mixed signal if the fifth, the sixth, the seventh and the eighth delay stages are all enabled.

6. A signal delay method, for a signal delay circuit including a first delay path and a second delay path, wherein the first delay path and the second delay path share at least one delay unit, the signal delay method comprising:
utilizing the first delay path to delay a first input signal to generate a first delay signal;
utilizing the second delay path to delay the first input signal to generate a second delay signal;
mixing the first delay signal and the second delay signal to generate a first mixed signal; and
utilizing a third delay path to delay the first input signal to generate a third delay signal; wherein the signal delay method further comprises mixing the third delay signal with at least one of the first delay signal and the second delay signal to generate a mixed signal;
wherein the signal delay circuit further comprises a fourth delay path, the signal delay method further comprising: utilizing the fourth delay path to delay the first input signal to generate a fourth delay signal, wherein the third and the fourth delay paths share at least one delay unit; and wherein the third delay signal and the fourth delay signal are mixed to generate a second mixed signal, and the first mixed signal is mixed with one of the third delay signal, the fourth delay signal and the second mixed signal to generate a new mixed signal.

7. The signal delay method of claim 6, wherein the signal delay circuit further comprises a fifth delay path, a sixth delay path, a seventh delay path and an eighth delay path, wherein the signal delay method comprises:
utilizing the fifth delay path to delay a second input signal to generate a fifth delay signal;
utilizing the sixth delay path to delay the second input signal to generate a sixth delay signal, wherein the fifth delay path and the sixth path share at least one delay unit;
utilizing the seventh delay path to delay the second input signal to generate a seventh delay signal;
utilizing the eighth delay path to delay the second input signal to generate an eighth delay signal, wherein the seventh delay path and the eighth path share at least one delay unit;
wherein the signal delay method further comprises mixing the fifth delay signal and the sixth delay signal to generate a fifth mixed signal and mixing the seventh delay signal and the eighth delay signal to generate a sixth mixed signal; and
wherein the fifth mixed signal is mixed with one of the seventh delay signal, the eighth delay signal and the sixth mixed signal to generate a new mixed signal.

8. A signal delay circuit, comprising:
a first delay stage, for delaying a first input signal to generate a first delay signal; and
a second delay stage, for cooperating with part of delay units of the first delay stage to delay the first input signal to generate a second delay signal;
wherein the signal delay circuit selectively enables the delay units of the first delay stage or the second delay stage; and wherein the signal delay circuit mixes the first delay signal and the second delay signal to generate a first mixed signal when the first delay stage and the second delay stage are both enabled;
a third delay stage, for delaying the first input signal to generate a third delay signal, wherein the signal delay circuit selectively enables delay units of the third delay stage; and
wherein the signal delay circuit mixes the third delay signal and at least one of the first, the second delay signals to generate a mixed signal when the third delay stage is enabled;
wherein the third delay signal includes a third delay amount, which is the same as one of a first delay amount from the first delay signal and a second delay amount from the second delay signal, wherein the signal delay circuit generates the first delay signal if the third delay amount is the same as the first delay amount, the first and third delay stages are enabled but the second delay stage is disabled; and
wherein the signal delay circuit generates the second delay signal if the third delay amount is the same as the second delay amount, the second and third delay stages are enabled but the first delay stage is disabled.

* * * * *